(12) United States Patent
Paik (10) Patent No.: US 7,749,777 B2
(45) Date of Patent: Jul. 6, 2010

(54) METHOD OF APPLYING ELECTRICAL STRESS TO LOW-TEMPERATURE POLY-CRYSTALLINE THIN FILM TRANSISTOR

(75) Inventor: Woon Suh Paik, Gyeonggi-do (KR)

(73) Assignee: Neopoly Inc., Seoul (KR)

( * ) Notice: Subject to any disclaimer, the term of this patent is extended or adjusted under 35 U.S.C. 154(b) by 406 days.

(21) Appl. No.: 11/230,658

(22) Filed: Sep. 21, 2005

(65) Prior Publication Data

US 2006/0024867 A1 Feb. 2, 2006

(51) Int. Cl.
*H01L 21/66* (2006.01)
(52) U.S. Cl. .................. 438/17; 257/E21.521; 324/769; 324/770
(58) Field of Classification Search .................. 438/17; 257/E21.521; 324/769, 770
See application file for complete search history.

(56) References Cited

U.S. PATENT DOCUMENTS 6,043,102 A * 3/2000 Fang et al. ..................... 438/14

* cited by examiner

*Primary Examiner*—Asok K Sarkar
(74) *Attorney, Agent, or Firm*—Rosenberg, Klein & Lee

(57) ABSTRACT

A low-temperature poly-crystalline thin film transistor in which amorphous silicon is crystallized using a laser crystallization method or a metal induced lateral crystallization method shows an unstable electrical property since crystallization is accomplished at a low temperature. When an electrical stress is applied to the low-temperature poly-crystalline thin film transistor and a lower substrate for a display device including the same, an electrical feature thereof is enhanced. To apply an electrical stress to the low-temperature poly-crystalline thin film transistor, the source of a thin film transistor is grounded, and a critical voltage which is determined according to a gate voltage applied between the drain and the source of the thin film transistor, at a state where any gate voltage has been applied between the gate and the source of the thin film transistor.

7 Claims, 8 Drawing Sheets

METHOD OF APPLYING ELECTRICAL STRESS TO LOW-TEMPERATURE POLY-CRYSTALLINE THIN FILM TRANSISTOR

BACKGROUND OF THE INVENTION

1. Field of the Invention

The present invention relates to a method of applying an electrical stress to a low-temperature poly-crystalline thin film transistor, and more particularly, to a method of applying an electrical stress to a low-temperature poly-crystalline thin film transistor for enhancing an electrical stability and characteristic by applying an electrical stress to the low-temperature poly-crystalline thin film transistor which has been crystallized using a laser crystallization method or a metal induced lateral crystallization method.

2. Description of the Related Art

In general, a thin film transistor which is used in a display device such as a liquid crystal display (LCD) or an organic light emitting diode (OLED) is fabricated by processes of depositing silicon on a transparent substrate such as glass or quartz, forming a gate insulation film and a gate electrode, injecting a dopant into a source and a drain, and then annealing the dopant-injected source and drain to thereby activate the same and to then form an insulation layer. An active layer forming a source, a drain and a channel of a thin film transistor is formed by depositing a silicon layer on a transparent substrate such as glass using a CVD (Chemical Vapor Deposition) method. In this case, a silicon layer directly deposited on a substrate by the CVD method and so on is an amorphous silicon film having a low electron mobility.

By the way, as a display device using a thin film transistor gradually requires for a fast operating speed and becomes compact in size, a degree of integration of a driving integrated circuit (IC) becomes large and an aperture ratio of a pixel region becomes reduced. Accordingly, an electron mobility on a silicon film should be heightened so that a driving circuit is formed simultaneously together with a pixel thin film transistor (TFT), and an aperture ratio of each pixel should be heightened. For this purpose, a technology of heat-treating an amorphous silicon layer and crystallizing the same into a poly-silicon layer of a poly-crystalline structure having a high electron mobility is being used.

A thin film transistor (TFT) made of a poly-crystalline thin film is a well known device, and is fabricated by forming a semiconductor thin film such as silicon on a semiconductor substrate on which an insulation layer has been formed, or on an insulation substrate such as glass. The thin film transistors are used in a variety of integrated circuits, in particular, a switching device which is formed on respective pixels on a liquid crystal display, or a driving circuit formed in a peripheral circuitry portion.

In order to obtain a poly-crystalline thin film which is used for the above-described thin film transistor, amorphous silicon deposited as is well known should be heat-treated at a temperature of 600° C. or higher. However, since a poly-crystalline silicon thin film transistor should be formed on a glass substrate as a device for driving a liquid crystal display, a heat-treatment temperature should be low at 600° C. or lower which is below a temperature at which the glass substrate is deformed. Thus, to solve the problem, the following two methods are under study.

According to a first method, laser is irradiated on a silicon thin film and part of the silicon thin film is dissolved so that the silicon thin film is crystallized. In this method, the temperature of the substrate is not made high but only part of the silicon thin film is heated. Accordingly, crystallization can be achieved without deforming the substrate, but problems are exposed in view of uniformity of crystallization, a high production cost, yield, and so on.

According to a second method, metal such as nickel (Ni), palladium (Pd), gold (Ag), and aluminum (Al) is made to contact amorphous silicon. or the metal is injected into the silicon. In this case, amorphous silicon is changed in phase into poly-crystalline even at a low temperature of 200° C. or so. This phenomenon is called MIC (Metal Induced Crystallization). In the case that a thin film transistor is fabricated using a MIC phenomenon, metal remains in the poly-crystalline constituting an active layer in the thin film transistor, to thereby cause current leakage to occur in a channel portion.

Recently, a method of crystallizing a silicon layer has been proposed using a MILC (Metal Induced Lateral Crystallization) phenomenon in which silicide produced by reaction of metal and silicon continues to propagate laterally to sequentially induce crystallization of silicon (S. W. Lee & S. K. Joo, IEEE Electron Device Letter, 17(4), P. 160, 1996). In order to create the MILC phenomenon, heat treatment should be performed at a temperature of 400-600° C.

Methods of fabricating low-temperature poly-crystalline thin film transistors using the conventional MILC method are disclosed in U.S. Pat. Nos. 6,197,623 and 6,689,647.

However, in the case that a thin film transistor is fabricated using the laser crystallization method or the MILC method, a transistor is completed at a low temperature. Accordingly, unstable electrical properties are exposed in the transistor. That is, high leakage current, threshold voltage shift, and so on occurs as the unstable electrical properties. Thus, in order to commercialize the thin film transistor, a technology of electrically stabilizing the thin film transistor is required at the time of fabricating the thin film transistor.

SUMMARY OF THE INVENTION

To solve the above problems, it is an object of the present invention to provide an electrical stress application method for improving an electrical performance of a low-temperature poly-crystalline thin film transistor in which an electrical stress is applied to the low-temperature poly-crystalline thin film transistor which is obtained by crystallizing amorphous silicon using a laser crystallization method or MILC (Metal Induced Lateral Crystallization) technology, to thereby enhance electrical characteristics of the low-temperature poly-crystalline thin film transistor.

It is another object of the present invention to provide an electrical stress application method for improving an electrical performance of a low-temperature poly-crystalline thin film transistor in which an electrical stress is applied to the low-temperature poly-crystalline thin film transistor to thereby stabilize electrical characteristics of the low-temperature poly-crystalline thin film transistor without adding a complicated process.

It is still another object of the present invention to provide a method of effectively applying an electrical stress to pixels and driving circuits to which low-temperature poly-crystalline thin film transistors are used.

It is yet another object of the present invention to provide a method of effectively applying an electrical stress to devices which use low-temperature poly-crystalline thin film transistors as storage capacitors, or liquid crystal displays and organic light emitting diodes.

To accomplish the above object of the present invention, according to a first aspect of the present invention, there is provided a method of applying an electrical stress to a low-temperature poly-crystalline thin film transistor including poly-silicon crystallized at a low temperature using a laser crystallization or MILC (Metal Induced Lateral Crystallization) method, the electrical stress application method characterized in that a source of a thin film transistor is grounded, and a critical voltage which is determined according to a gate voltage applied between the drain and the source of the thin film transistor, at a state where any gate voltage has been applied between the gate and the source of the thin film transistor.

In this case, it is preferable that the gate voltage is set in the range of −100V to 100V, and the critical voltage determined according to the gate voltage between the drain and source of the transistor is set in the range of 0.5 to 2 times as the gate voltage.

Further, the applied gate voltage is preferably set to make the thin film transistor turned off.

According to a second aspect of the present invention, there is provided a method of applying an electrical stress to a number of low-temperature poly-crystalline thin film transistors including poly-silicon in which a number of thin film transistors are crystallized at a low temperature using a laser crystallization method or a MILC (Metal Induced Lateral Crystallization) method, for use in a lower insulation substrate for an active matrix display device which includes a pixel array including a number of thin film transistors (TFTs) where a number of pixel electrodes are disposed in a matrix pattern at a crossing portion of a number of gate lines aligned in a row direction and a number of data lines aligned in a column direction, a drain electrode is connected with the respective pixel electrodes, and a source electrode is connected with the respective data lines, the electrical stress application method comprising the steps of: extensively forming a gate incorporation line and a data incorporation line both which incorporatively connect the number of gate lines and the number of data lines, respectively; applying a first voltage capable of turning on each thin film transistor to the gate electrode of each thin film transistor, via the gate incorporation line and the number of gate lines; applying a second voltage to the data incorporation line and the number of data lines at the state where the thin film transistor has been turned on, to thereby electrically charge a storage capacitor located below the pixel electrode connected with the drain electrode of the thin film transistor; applying a third voltage for applying an electrical stress to the gate electrode of the thin film transistor via the gate incorporation line and the number of gate lines; and applying a ground voltage (Vgnd) to the source electrode of the thin film transistor via the data incorporation line and the number of data lines, to thereby discharge the charges charged in the storage capacitor via the thin film transistor, wherein the second voltage increases in proportion with the third voltage.

In this case, the second voltage is set in the range of 0.5 to 2 times as the third voltage.

Further, the thin film transistor is preferably set to be at a turned-off state according to application of the third voltage so that the thin film transistor or line is not overstressed at the time of application of the electrical stress.

Further, the electrical stress application method according to the second aspect of the present invention further comprises the steps of: extensively forming a number of first switches interposed between the number of gate lines and the gate incorporation line, a number of second switches interposed between the number of data lines and the data incorporation line, and control lines for applying control signals which can turn on/off the number of first and second switches; and turning on the number of first and second switches via the control lines at the time of applying the electrical stress.

According to a third aspect of the present invention, there is provided a method of applying an electrical stress to a number of low-temperature poly-crystalline thin film transistors including poly-silicon in which a number of thin film transistors are crystallized at a low temperature using a laser crystallization method or a MILC (Metal Induced Lateral Crystallization) method, for use in a lower insulation substrate for an active matrix display device which includes a pixel array including a number of thin film transistors (TFTs) where a number of pixel electrodes are disposed in a matrix pattern at crossing portions in a row direction and a column direction, and a drain electrode is connected with the respective pixel electrodes, the electrical stress application method comprising the steps of: extensively forming a number of gate connection lines aligned in a row direction in order to connect the respective gates, and a gate incorporation line which incorporatively connects the number of gate connection lines, a number of source connection lines aligned in a column direction in order to connect the respective sources, and a source incorporation line which incorporatively connects the number of source connection lines, and a number of drain connection lines aligned in a column direction in order to connect the respective drains, and a drain incorporation line which incorporatively connects the number of drain connection lines, with respect to the number of the respective thin film transistors; and applying the ground voltage to the source incorporation line of the thin film transistor, and applying a critical voltage which is determined according to a gate voltage between the drain incorporation line and the source incorporation line of the thin film transistor, at a state where any gate voltage has been applied between the gate incorporation line and the source incorporation line of the thin film transistor.

In this case, the electrical stress is preferably applied at a state where the thin film transistor is turned off.

In the case that the thin film transistor is a P-type thin film transistor when the thin film transistor is turned off, a gate voltage applied via the gate incorporation line is set to be in the range of −3V to 30V, and a drain voltage applied via the drain incorporation line is set to be in the range of −30V to 0V. In the case that the thin film transistor is an N-type thin film transistor, a gate voltage applied via the gate incorporation line is set to be in the range of 3V to −30V, and a drain voltage applied via the drain incorporation line is set to be in the range of 30V to 0V.

In this case, before extensively forming the gate connection lines, the source connection lines and the drain connection lines, the electrical stress application method according to the third aspect of the present invention further comprises the steps of forming a pixel array including the number of pixel electrodes and the number of thin film transistors, and forming an insulation film on the upper portion of a lower insulation substrate; and forming a number of contact plugs which are connected with the respective gates, sources and drains of the number thin film transistors located below the insulation film.

According to a fourth aspect of the present invention, there is provided a method of applying an electrical stress to a number of low-temperature poly-crystalline thin film transistors including poly-silicon crystallized at a low temperature using a laser crystallization or MILC (Metal Induced Lateral Crystallization) method, for use in a lower insulation substrate for an active matrix display device which includes a pixel array including a number of thin film transistors (TFTs) where a number of pixel electrodes are disposed in a matrix pattern at a crossing portion of a number of gate lines aligned in a row direction and a number of data lines aligned in a column direction, a drain electrode is connected with the respective pixel electrodes, a gate electrode is connected with the respective gate lines, and a source electrode is connected with the respective data lines, and horizontal and vertical driving circuits disposed in the periphery of the pixel array, the electrical stress application method comprising the steps of: applying a first voltage capable of turning on each thin film transistor to the gate electrode of each thin film transistor, via the number of gate lines from the vertical driving circuit; applying a second voltage to the number of data lines from the horizontal driving circuit at the state where the thin film transistor has been turned on, to thereby electrically charge a storage capacitor located below the pixel electrode connected with the drain electrode of the thin film transistor, in advance; applying a third voltage for applying an electrical stress to the gate electrode of the thin film transistor via the number of gate lines; and applying a ground voltage (Vgnd) to the source electrode of the thin film transistor via the number of data lines, to thereby discharge the charges charged in the storage capacitor via the thin film transistor.

In this case, it is preferable that the third voltage is set in the range of −100V to 100V, and the second voltage is set in the range of 0 to −100V when the thin film transistor is a P-type thin film transistor, and is set in the range of 0 to 100V when the thin film transistor is an N-type thin film transistor.

Further, the thin film transistor is preferably set to be at a turned-off state, according to application of the third voltage. Further, the second voltage is a direct-current (DC) voltage or an alternating-current (AC) voltage including a critical voltage or higher.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

An electrical stress application method according to a preferred embodiment of the present invention will be described with reference to the accompanying drawings.

Figure 1:
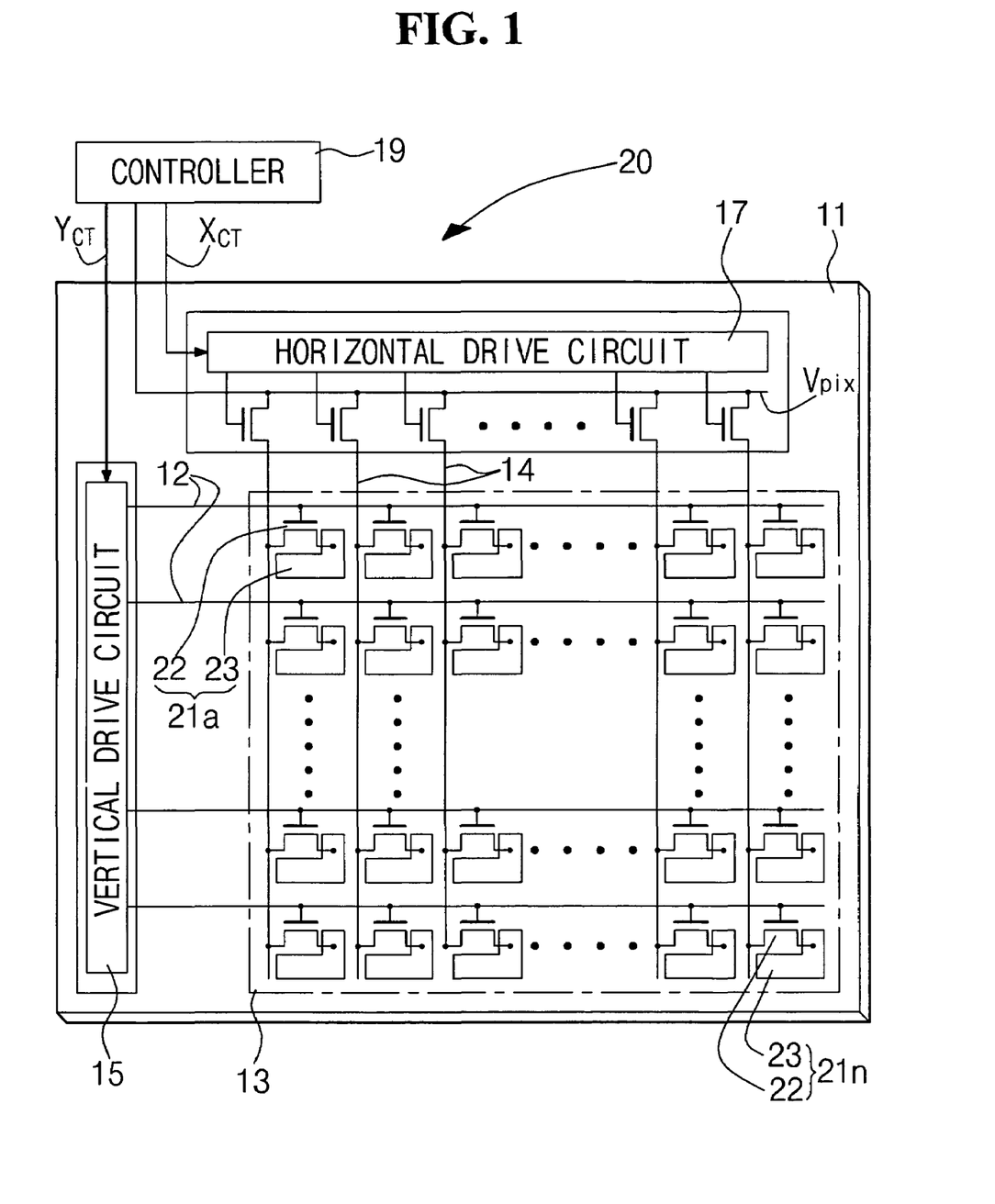
FIG. 1 is a schematic circuit diagram showing a lower insulation substrate for an active matrix display device using a thin film transistor.
Figure 2:
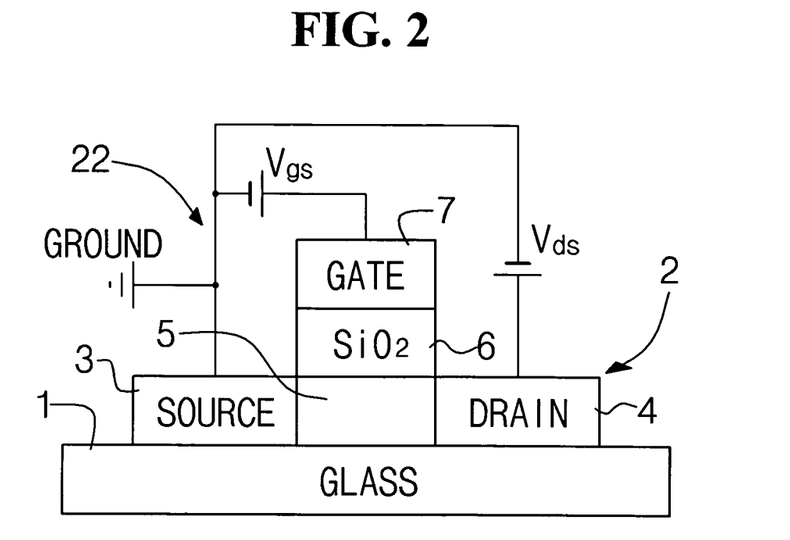
FIG. 2 shows the structure of the thin film transistor shown in FIG. 1, which is a circuitry diagram for explaining a method of applying an electrical stress to a low-temperature poly-crystalline thin film transistor according to a first embodiment of the present invention in order to enhance an electrical performance.

FIG. 1 is a schematic circuit diagram showing a lower insulation substrate for an active matrix display device using a thin film transistor. FIG. 2 shows the structure of the thin film transistor shown in FIG. 1, which is a circuitry diagram for explaining a method of applying an electrical stress to a low-temperature poly-crystalline thin film transistor according to a first embodiment of the present invention in order to enhance an electrical performance.

First, an active matrix display using thin film transistors has a structure of a panel having an electrooptical material such as liquid crystal between a pair of upper and lower insulation substrates. As shown in FIG. 1, a pixel array 13 on which a number of pixels 21a-21n are aligned in a matrix pattern are disposed at the central portion of a lower insulation substrate 11. A vertical driving circuit 15 and a horizontal driving circuit 17 are disposed at the left and upper portions of the pixel array 13, respectively. Also, the vertical driving circuit 15 and the horizontal driving circuit 17 are connected with a controller 19 which receives an image signal and a synch signal supplied from external sources (not shown) and generates a pixel image signals Vpix, a vertical scan signal $Y_{CT}$, and a horizontal scan signal $X_{CT}$.

A number of gate lines 12 (called scan lines) aligned in a row direction and a number of data lines 14 aligned in a column direction are formed in the pixel array 13. A number of pixels 21a-21n including a number of pixel electrodes 23 and a number of thin film transistors (TFTs) 22 which drive the number of pixel electrodes 23, are disposed at a crossing portion between the number of gate lines 12 and the number of data lines 14, respectively.

The thin film transistor 22 for a pixel is connected with a gate line 12 corresponding to a gate electrode 7 of FIG. 2. Also, a drain region 4 of FIG. 2 is connected with a corresponding pixel electrode 23 and a source region 3 of FIG. 2 is connected with a data line 14. A storage capacitor (not shown) is formed between the pixel electrode 23 and the bottom of the substrate. Also, the number of gate lines 12 are connected with the vertical driving circuit 15 and the number of data lines 14 are connected with the horizontal driving circuit 17.

A driving circuit including the vertical driving circuit 15 and the horizontal driving circuit 17 is also integrally formed on the lower insulation substrate 11 by using thin film transistors. Further, a test pattern (not shown) exists outside of the panel at the time of fabricating a liquid crystal display (LCD) or an organic light emitting diode (OLED).

In the case of a thin film transistor 22 for a pixel as shown in FIG. 2, the, impurities are doped on a semiconductor layer 2 made of poly-crystalline silicon of an island shape formed on the upper portion of a glass substrate 1, and source and drain regions 3 and 4 are disposed in both sides of a channel region 5, respectively. A gate electrode 7 is formed on the upper portion of the channel region 5 via for example a gate insulation film 6 made of $SiO_2$.

The semiconductor layer 2 included in the pixel thin film transistor 22 and the test pattern is made of poly silicon which is obtained by crystallizing an amorphous semiconductor layer at a low temperature of 600° C. or lower using a MILC (Metal Induced Lateral Crystallization) method.

A method of applying an electrical stress to the thin film transistor is classified into an individual application method (a first embodiment) and a batch application method.

Also, the batch application method is classified into a method (a second embodiment) of forming a separate line for applying an electrical stress to thin film transistors in a lower insulation substrate 11, that is, a thin film transistor panel at the time of fabrication of the panel, and a method (a third embodiment) of applying an electrical stress to thin film transistors 22 using the gate lines 12 and the data lines 14.

Referring to FIG. 2, the electrical stress application method for improving an electrical performance of a low-temperature poly-crystalline thin film transistor according to a first embodiment of the present invention is to apply an electrical stress individually to the respective thin film transistors.

The individual electrical stress application method according to the first embodiment of the present invention is not used to apply an electrical stress to a thin film transistor in the respective pixels but is chiefly used to apply an electrical stress to a thin film transistor existing in a test pattern outside of the panel which always exists at the time of fabrication of LCD or OLED.

In the case of the individual electrical stress application method, terminals of respective thin film transistors are connected using probe tips for the gate, source and drain of each thin film transistor, and an electrical stress is applied individually to each thin film transistor.

In the case of the individual electrical stress application method of applying an electrical stress to an individual thin film transistor 22 according to the first embodiment of the present invention, a source region 3, that is, a source electrode drawn out from the source region is connected with the ground, a gate voltage Vgs is applied between the gate electrode 7 and the source electrode 3, and simultaneously a particular drain voltage Vds is applied between the drain electrode 4 and the source electrode 3.

Figure 3:
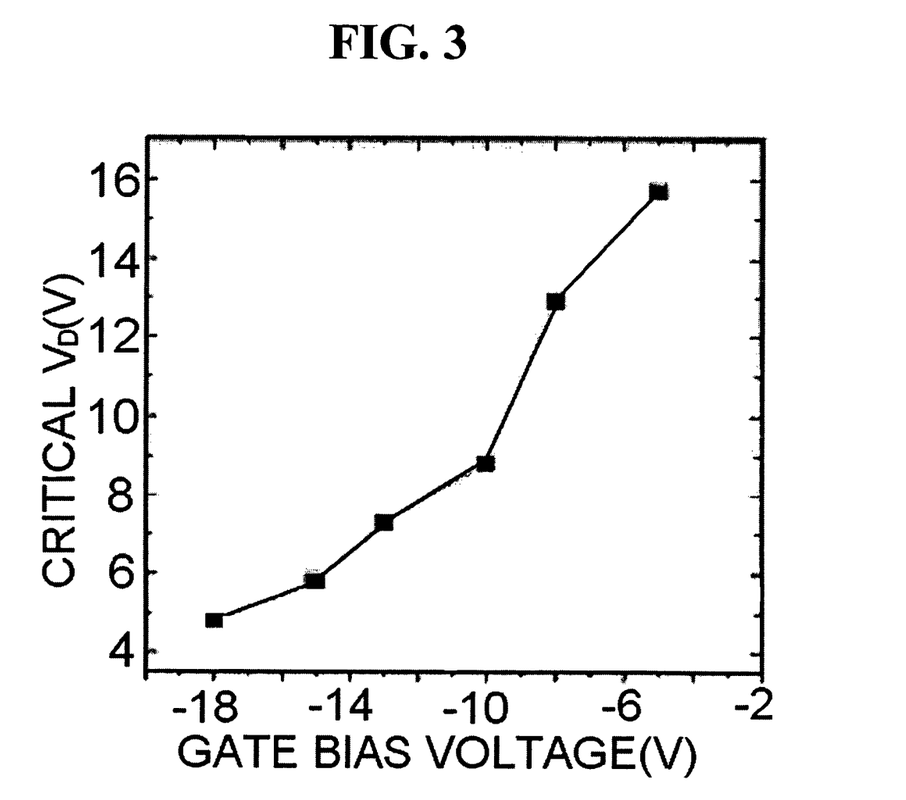
FIG. 3 is a graphical view illustrating a change of a critical voltage Ads depending upon a gate bias voltage Vgs in FIG. 2.

Here, the drain voltage Vds which should be applied between the drain electrode 4 and the source electrode 3 is limited to have the minimum drain voltage Vds to be applied as a critical drain voltage. The critical drain voltage increases as the gate voltage Vgs increases as shown in FIG, 3.

In this case, any voltage can be applied as the gate voltage Vgs applied to apply an electrical stress to the gate electrode 7 in the thin film transistor 22 without having any particular limitation. Thus, a voltage of a range of doing no harm to thin film transistors or lines, that is, a voltage of −1000V to 1000V is applied as the gate voltage Vgs. In this state, a voltage of a critical drain voltage Vds or higher can be applied as the drain voltage for the drain electrode 4, in proportion with the gate voltage Vgs.

When the gate voltage Vgs is applied, the critical drain voltage Vds is set to be in the range of 0 to −100V in the case of a P-type thin film transistor, and in the range of 0 to 100V in the case of an N-type thin film transistor.

Also, a preferable condition that no harm is done for thin film transistors and lines is to apply an electrical stress to a thin film transistor when the thin film transistor is at a turned-off state. Thus, in the case that a P-type thin film transistor is turned off, a gate voltage Vgs is preferably in the range of −3V to 30V, and a drain voltage Vds is preferably in the range of −30V to 0V. Meanwhile, in the case that an N-type thin film transistor is turned off, a gate voltage Vgs is preferably in the range of 3V to −30V, and a drain voltage Vds is preferably in the range of 30V to 0V.

The gate voltage Vgs is illustrated as a voltage range for applying an electrical stress to a thin film transistor at a state where the thin film transistor is turned off. However, an electrical stress can be applied even at a state where a thin film transistor is turned on. The drain voltage is not limited to the above-described voltage range.

Figure 4A:
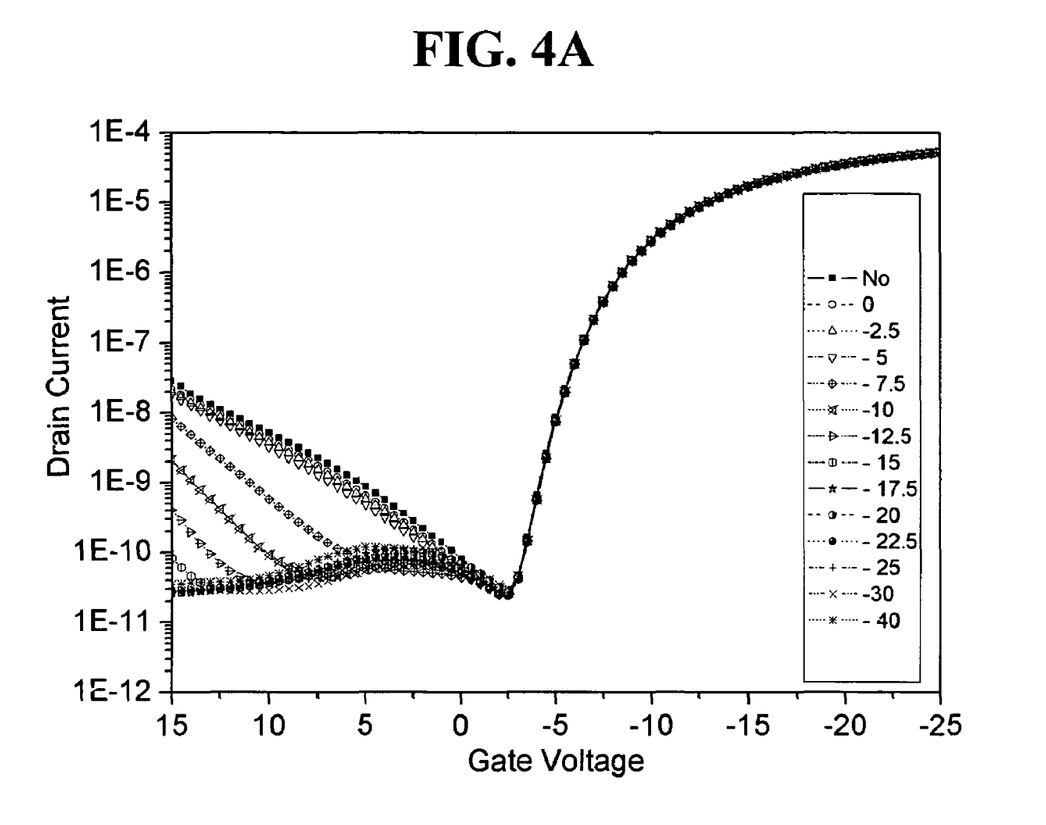
FIGS. 4A through 4C are graphical views showing a current-voltage (I-V) characteristic of a thin film transistor after an electrical stress voltage has been applied to a P-type thin film transistor by changing a drain voltage Vds at a state where a gate voltage Vgs is +10V, 0V, or −10V, respectively.
Figure 4B:
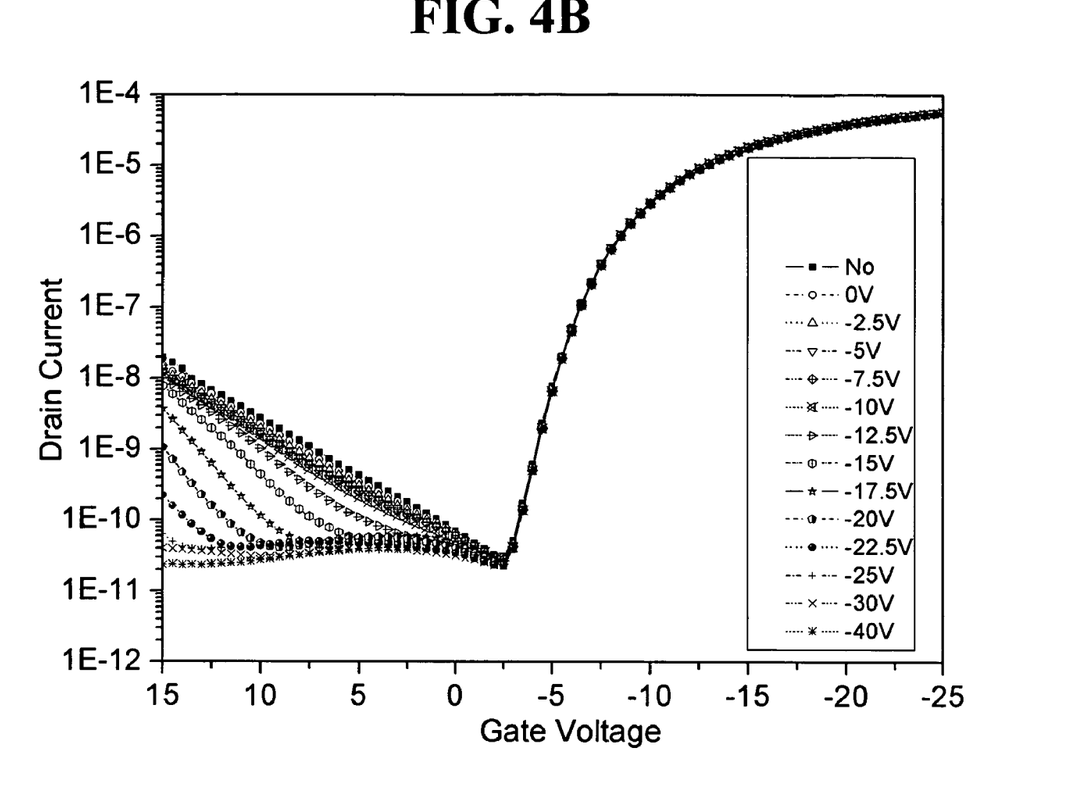
Figure 4C:
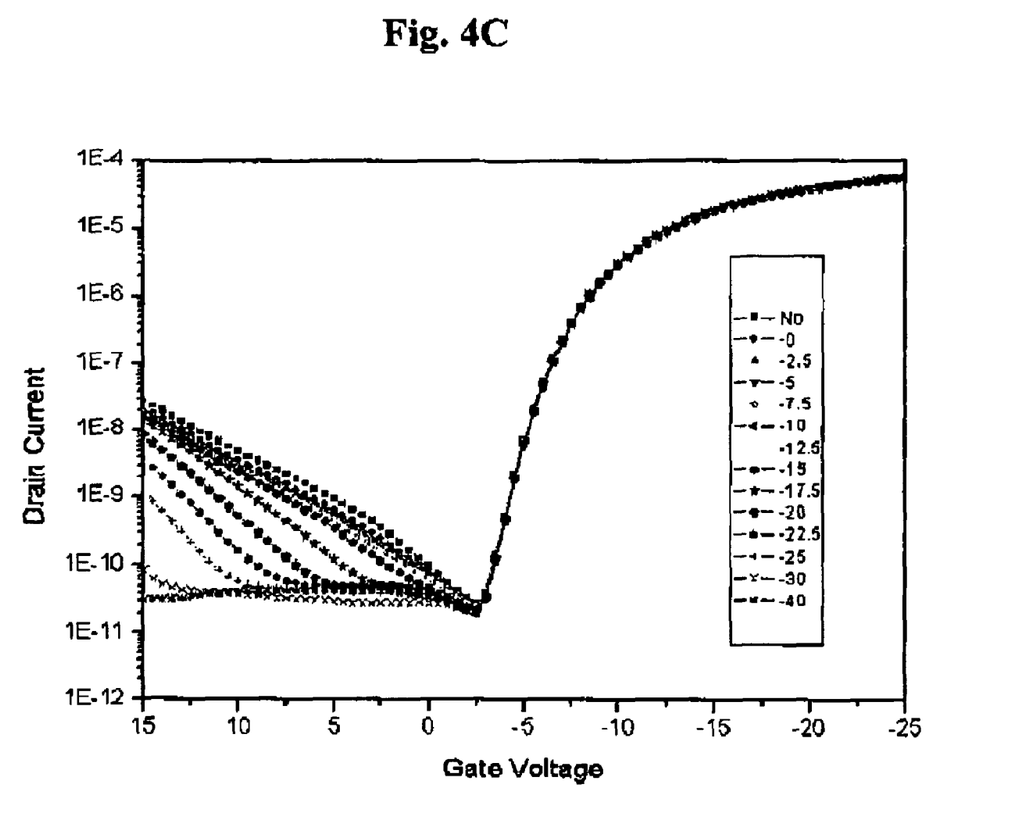

FIGS. 4A through 4C are graphical views showing a current-voltage (I-V) characteristic curve of a thin film transistor when a drain voltage Vds is changed at a state where a gate voltage Vgs is +10V, 0V, or −10V, respectively.

Referring to FIG. 4A, it can be seen that the minimum drain voltage, that is, the critical drain voltage (Vds) to be applied in the case of applying an electrical stress by applying a voltage of 10V to the gate of a thin film transistor is about −7.5V in which the thin film transistor is turned off in the case of a P-type thin film transistor, and an electrical stress application effect can be obtained if a voltage higher than the −7.5V in the absolute value is applied. Referring to FIG. 4B, in the case that 0V is applied to the gate of a thin film transistor, the critical drain voltage Vds is about −12.5V. Referring to FIG. 4C, in the case that −10V is applied to the gate of a thin film transistor, the critical drain voltage Vds is about −17.5V, in which the thin film transistor is turned on.

Thus, from the experimental results, the critical drain voltage Vds should be increased in proportion with the gate voltage, and it is preferable that an increasing width of the drain voltage is set to be 0.5 to 2 times as an increase in the gate voltage in the case of a P-type thin film transistor.

Here, the drain voltage Vds is generally a direct-current (DC) voltage, but may be also an alternating-current (AC) voltage or pulse-type voltage including a critical drain voltage Vds or higher.

If a stress voltage is applied to a thin film transistor at the above-described condition, an electrical stress effect can be obtained. The electrical stress effect appears as defects existing in the silicon of the semiconductor layer 2 and at the neighborhood of an interface between the silicon and the gate insulation film 6 are passivated by the gate voltage Vgs and the drain voltage Vds.

Figure 4D:
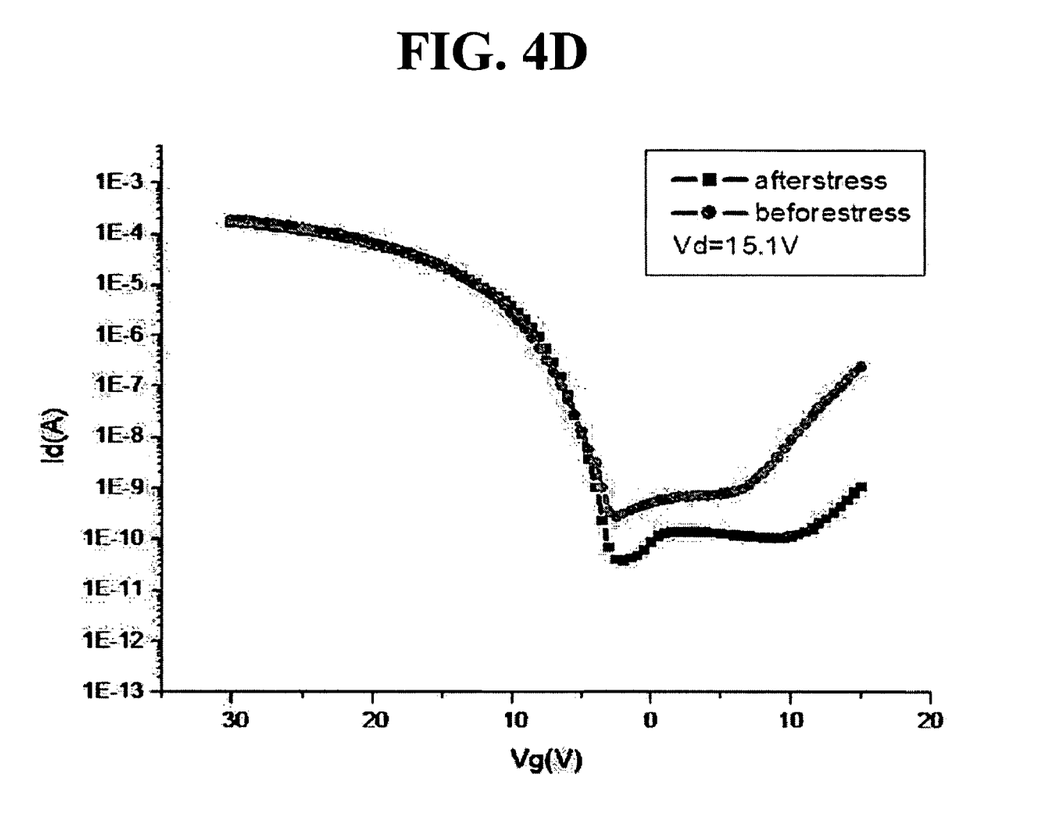
FIG. 4D is a graphical view showing a current-voltage (I-V) characteristic of a thin film transistor before and after an electrical stress voltage has been applied to a poly-crystalline thin film transistor according to the first embodiment of the present invention.

FIG. 4D is a graphical view showing an electrical characteristic of a thin film transistor before and after an electrical stress voltage has been applied to a low-temperature poly-crystalline thin film transistor 22 according to the first embodiment of the present invention of FIG. 2.

FIG. 4D shows an current-voltage (I-V) characteristic curve before/after an electrical stress is applied to a P-type thin film transistor. As electrical stress application conditions, the ground voltage is applied to the source, 10V is applied to the gate, and −10V is applied to the drain. As can be seen from FIG. 4D, the minimum leakage current has been greatly reduced from $10^{-10}$ to $10^{-11}$. It can be also seen that the leakage current value has been greatly reduced in the case that the gate voltage Vg is positive in an off-state.

That is, in the graph (-●-) before the electrical stress application and the graph (-■-) after the electrical stress application on the I-V characteristic curve of the thin film transistor, it can be seen that the drain current Id has been greatly reduced in an interval of about −3V to 20V of the gate voltage Vg. The drain current Id corresponds to the leakage current. In the case that the drain leakage current value is high, the quality of images is lowered and driving errors occur. That is, the leakage current characteristic of a thin film transistor is enhanced by applying an electrical stress to the thin film transistor.

Further, from the slope of the I-V characteristic curve between −3V and −10V, it can be seen that a slope after the electrical stress application, that is, a sub-threshold slope has been increased in comparison with the slope before the electrical stress application. This means that a shift from a turned-on state to a turned-off state has abruptly occurred after the electrical stress application. Accordingly, it can be seen that a switching characteristic of a transistor has been enhanced.

In the case of the individual electrical stress application method according to the first embodiment of the present invention, an individual voltage should be applied to each thin film transistor while contacting the gate, source and drain of each thin film transistor by use of probe tips. However, since the number of thin film transistors is large and the size of the thin film transistor is very small, the individual electrical stress application method is not favorably applied for the thin film transistors for pixels. Thus, the individual electrical stress application method is not used to apply an electrical stress to a thin film transistor in the respective pixels but is chiefly used to apply an electrical stress to a thin film transistor existing in a test pattern outside of the panel which always exists at the time of fabrication of LCD or OLED.

Figure 5:
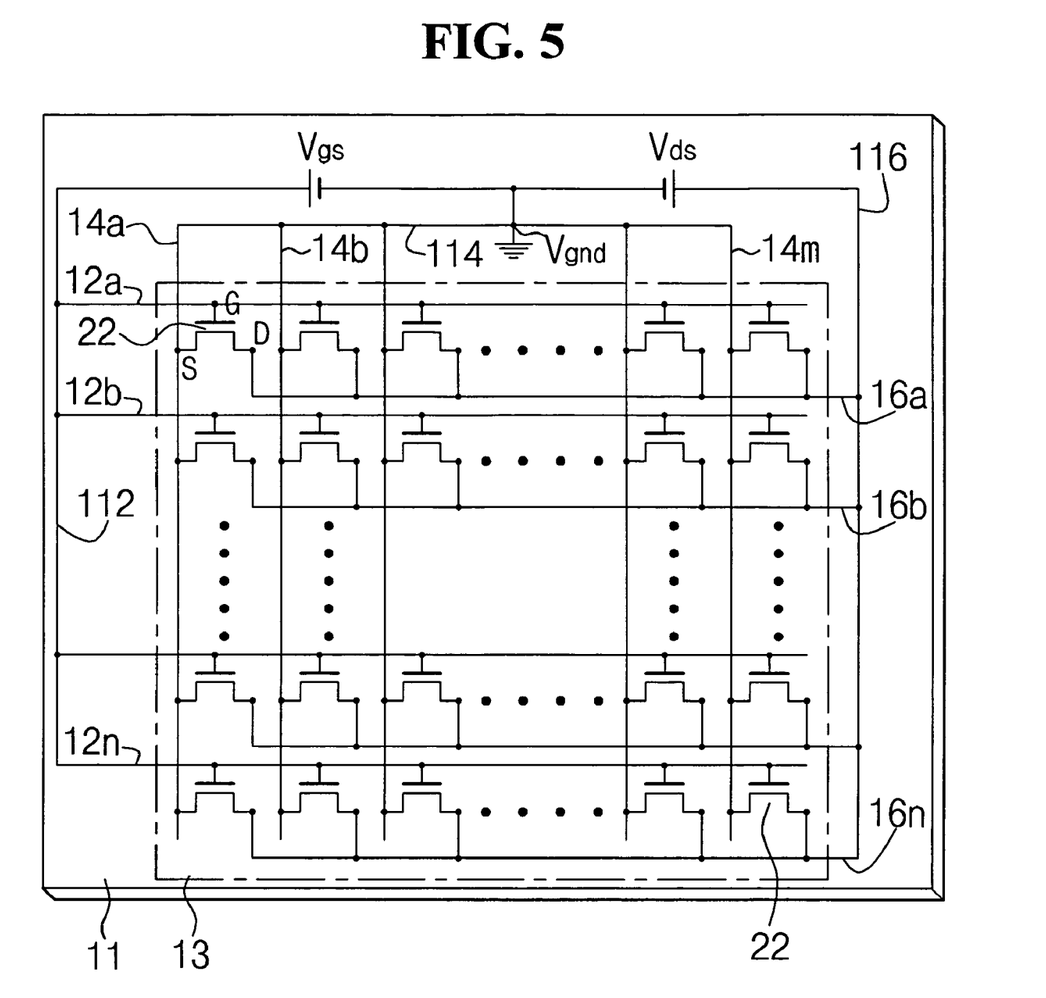
FIG. 5 is a circuitry diagram for explaining a method of applying an electrical stress to a low-temperature poly-crystalline thin film transistor according to a second embodiment of the present invention.

Hereinbelow, a batch electrical stress application method according to a second embodiment of the present invention will be described with reference to FIG. 5. FIG. 5 is a schematic circuitry diagram for explaining a batch electrical stress application method for a number of thin film transistors 22 in which each thin film transistor 22 is not illustrated by semiconductor patterns but by symbols for convenience of explanation.

The batch electrical stress application method according to the second embodiment of the present invention is a method of forming separate lines at the time of fabrication of a panel in order to apply an electrical stress to thin film transistors 22 disposed in a number of pixels in the panel.

First, according to a well-known method, a number of pixels made of a number of pixel electrodes and a number of thin film transistors are formed in a pixel array 13 on a lower insulation substrate 11 of FIG. 5, and an insulation film is formed on the upper portion of the lower insulation substrate 11.

Then, contacts (not shown) are formed in the gates (G), the sources (S) and the drains (D) of the number of thin film transistors 22 below the insulation film. Thereafter, a metal film made of any one of Mo, MoW, Al, and Cu is formed on the whole surface of the lower insulation substrate 11 so as to be connected with each contact.

Then, the metal film is patterned using a photographical etching process, to accordingly form three kinds of connection lines which are connected with the gate (G), source (S), and drain (D) of each thin film transistor 22.

That is, a number of gate connection lines 12a, 12b, . . . , and 12n which are aligned in a row direction are formed in order to connect with each gate (G). Also, a number of drain connection lines 16a, 16b, . . . , and 16n which are aligned in a row direction are formed in order to connect with each drain (D). Also, a number of source connection lines 14a, 14b, . . . , and 14m which are aligned in a column direction are formed in order to connect with each source (S). The respective gate, source, and drain connection lines are patterned as shown in FIG. 5 so as to be connected with a single incorporation line 112, 114, or 116.

In this case, it is required that two kinds of lines 12a, 12b, . . . , 12n, 16a, 16b, . . . , 16n, 112, and 116 be firstly formed in order to avoid each line from being crossed, and then after forming an insulation film, the remaining one kind of lines 14a, 14b, . . . , 14m, and 114 be additionally formed.

In this case, the number of gate connection lines 12a, 12b, . . . , and 12n are formed in the same manner as those of the number of gate lines 12 of FIG. 1, and the number of source connection lines 14a, 14b, . . . , and 14m are formed in the same manner as those of the number of data lines 14 of FIG. 1.

Thereafter, as in the first embodiment of the present invention, a gate voltage Vgs corresponding to −100V to 100V is applied to the single gate incorporation line 112 connecting all the number of gates (G), the ground voltage Vgnd is applied to the single source incorporation line 114 connecting all the number of sources (S), and a critical drain voltage Vds which is determined by the applied gate voltage Vgs is applied to the single drain incorporation line 116 connecting all the number of drains (D).

As a result, an electrical stress can be applied to the thin film transistors 22 disposed in the number of pixels in the panel at a time. The thin film transistor 22 of each pixel can obtain an electrical stress effect in the same manner as that of the first embodiment of the present invention.

Meanwhile, after the electrical stress application has been completed, necessary lines remain but unnecessary lines are removed, among the three kinds of connection lines and incorporation lines 12a, 12b, . . . , 12n, 16a, 16b, 16n, 14a, 14b, . . . , 14m, 112, 116, and 114 which are separately formed on the substrate in order to apply an electrical stress to the thin film transistors 22. Otherwise, since all the connection lines are removed, necessary lines are newly formed in the same manner as that of FIG. 1.

Hereinbelow, a batch electrical stress application method according to a third embodiment of the present invention will be described with reference to FIG. 6.

Figure 6:
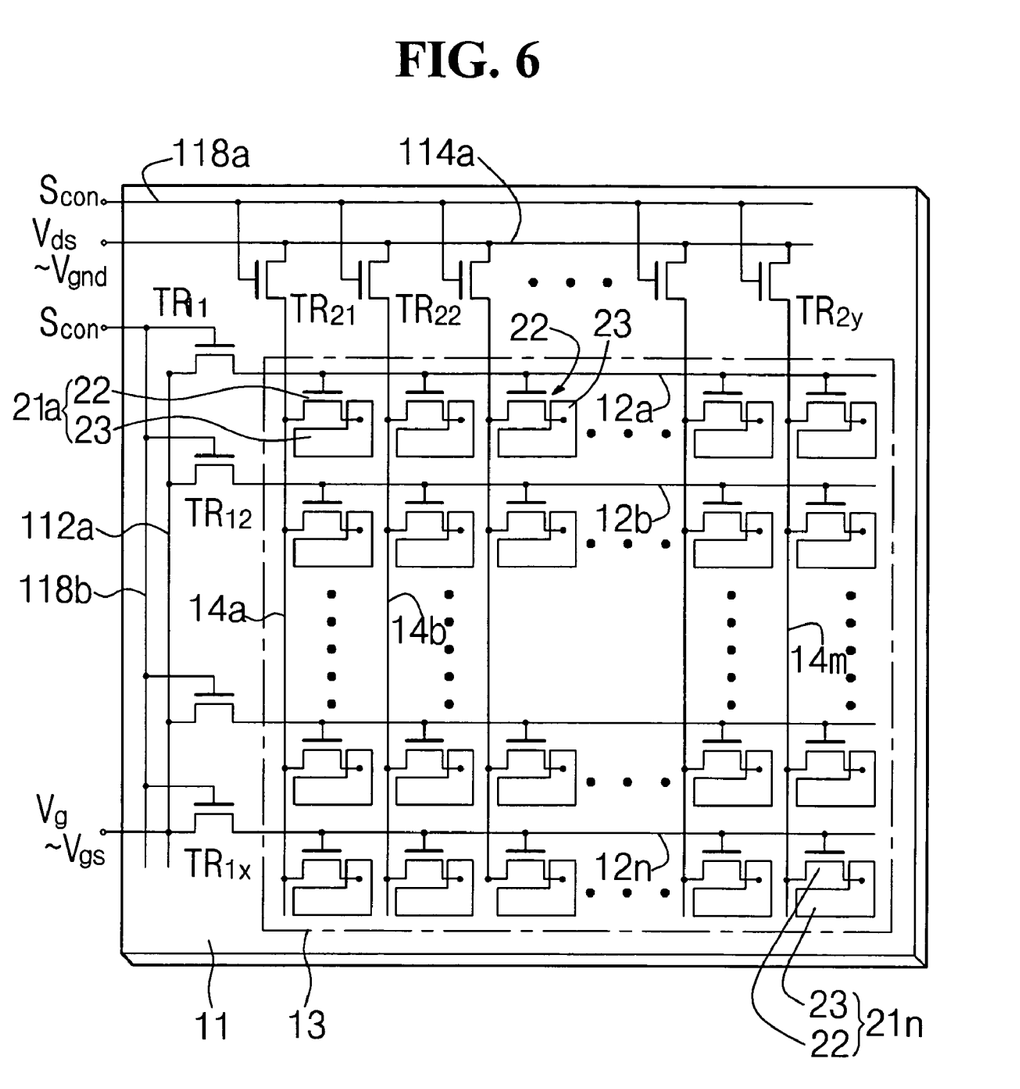
FIG. 6 is a circuitry diagram for explaining a method of applying an electrical stress to a low-temperature poly-crystalline thin film transistor according to a third embodiment of the present invention.

FIG. 6 is a circuitry diagram for explaining a method of applying an electrical stress to a low-temperature poly-crystalline thin film transistor according to a third embodiment of the present invention.

Referring to FIG. 6, the batch electrical stress application method according to a third embodiment of the present invention is a method of applying an electrical stress to thin film transistors 22 of respective pixels 21a to 21n, using a number of gate lines (that is, scan lines) 12a to 12n and a number of data lines 14a to 14m which are formed in order to drive the respective pixels 21a to 21n in a pixel array 13 where a number of pixels 21a to 21b are aligned in a matrix pattern at the central portion of an existing lower insulation substrate 11.

In the third embodiment of the present invention, a number of first switches TR11 to TR1x made of a switching transistor, respectively are formed in the rear end of the respective gate lines 12a to 12n, and the number of first switches are connected with a single gate incorporation line 112a, and a number of second switches TR21 to TR2y made of a switching transistor, respectively are formed in the rear end of the respective data lines 14a to 14m, and the number of second switches are connected with a single data incorporation line 114a. Also, controlling lines 118a and 118b are formed in order to applying control signals Scon which can turn on/off the first and second switches TR11 to TR1x and TR21 to TR2y.

Thus, at the time of applying an electrical stress to the thin film transistors, control signals Scon are applied via the controlling lines 118a and 118b, to thereby turn on all the switches TR11 to TR1x and TR21 to TR2y. Then, electrical stress voltages are applied to all of the gate lines 12a to 12n and the data lines 14a to 14m via the gate and data incorporation lines 112a and 114a.

First, the gate voltage Vg which can turn on the thin film transistors 22 is applied to the respective gates of the thin film transistors 22 via the number of gate lines 12a to 12n, to thereby turn on the thin film transistors 22.

Then, if the critical drain voltage Vds is applied via the data incorporation line 114a and the number of data lines 14a to 14m at the state where the thin film transistors 22 have been turned on, the applied critical drain voltage Vds is transferred toward the respective drains of the thin film transistors 22. As a result, an electrical charge is charged in a storage capacitor (not shown) formed below the pixel electrodes 23 connected with the drains, respectively.

Then, if a gate voltage Vgs for applying an electrical stress to the respective gates of the thin film transistors 22 is applied via the gate incorporation line 112a and the gate lines 12a to 12n, and the ground voltage Vgnd is applied to the respective sources of the thin film transistors 22 via the data incorporation line 114a and the data lines 14a to 14m, the electrical charge charged in the storage capacitor is discharged toward the sources via the thin film transistors 22. Accordingly, the thin film transistors 22 of the respective pixels can get an electrical stress effect.

In this case, it is preferable that the gate voltage Vgs which is applied to the gate for applying an electrical stress thereto is determined so that the thin film transistors are set to be a turned-off state, respectively, to thereby prevent the charges charged in the storage capacitor from being abruptly discharged.

The electrical stress application method according to the third embodiment of the present invention is a method of probing the gate lines 12a to 12n and the data lines 14a to 14m all at a time, and applying a voltage for applying an electrical stress to the gate lines 12a to 12n and the data lines 14a to 14m all at a time.

As a result, the thin film transistors of the respective pixels can obtain the same electrical stress effect as that of the first embodiment of the present invention.

If all the switches TR11 to TR1x and TR21 to TR2y are turned off using the controlling lines 118a and 118b at the time of actually driving a panel, among the gate and data incorporation lines 112a and 114a, the controlling lines 118a and 118b, and the first and second switches TR11 to TR1x and TR21 to TR2y, all of which are additionally formed in order to apply an electrical stress voltage according to the third embodiment of the present invention, the respective gate lines 12a to 12n and the respective data lines 14a to 14m are disconnected to thereby have no influences upon the panel. Thus, in this case, the separate lines do not need to be removed.

In the third embodiment of the present invention, the gate and data incorporation lines 112a and 114a are formed via the first and second switches TR11 to TR1x and TR21 to TR2y. In the case that an electrical stress voltage is applied, the electrical stress voltage is applied at the state where the first and second switches TR11 to TR1x and TR21 to TR2y are turned on via the controlling lines 118a and 118b. However, the gate and data incorporation lines 112a and 114a are directly connected with the gate lines 12a to 12n and the data lines 14a to 14m, without passing through the first and second switches TR11 to TR1x and TR21 to TR2y, and an electrical stress voltage can be applied to the gate lines 12a to 12n and the data lines 14a to 14m.

Meanwhile, another electrical stress voltage application method is a method of applying an electrical stress to a number of gate lines 12 and a number data lines 14 via driving circuits formed on the lower insulation substrate 11 whose panel has been completely fabricated as shown in FIG. 1, and sequentially transferring the voltage to the thin film transistors 22 of the respective pixels.

That is, in FIG. 1, each gate line 12 is sequentially designated via the vertical driving circuit 15 connected with the number of gate lines 12, and then a voltage is sequentially applied to the thin film transistors 22 of the respective pixels as in the third embodiment of the present invention via the horizontal driving circuit 17 connected with the number of data lines 14 at the state where the thin film transistors 22 of the corresponding row have been turned on.

That is, the critical drain voltage Vds is applied via the number of data lines 14 from the horizontal driving circuit 17 at the state where the thin film transistors 22 have been turned on, and an electrical charge is charged in advance in a storage capacitor (not shown) formed below the pixel electrodes 23 formed below the respective drains of the thin film transistors 22.

Thereafter, a gate voltage Vgs for applying an electrical stress to the respective gates of the thin film transistors 22 is applied to the gates via the gate lines 12 from the vertical driving circuit 15, and the ground voltage Vgnd is applied to the respective sources of the thin film transistors 22 via the data lines 14 from the horizontal driving circuit 17. Accordingly, if a driving voltage of the thin film transistors is changed so that the electrical charges charged in the storage capacitor are discharged toward the sources via the thin film transistors 22, the thin film transistors 22 of the respective pixels can get an electrical stress effect.

The vertical and horizontal driving circuits 15 and 17 which are formed simultaneously together with the pixel thin film transistors on the substrate play a role of sequentially transferring a voltage applied from the controller 19 to the thin film transistors via each line. Thus, in order to generate a voltage appropriate for applying an electrical stress to the thin film transistors using the electrical stress application methods according to the present invention, it is necessary to use a universal driver which can freely generate a user's desired voltage signal instead of a controller which is used for an actual panel operation.

As described above, if an electrical stress is applied to a low-temperature poly-crystalline thin film transistor fabricated according to a low-temperature crystallization method such as a MILC (Metal Induced Lateral Crystallization) method or a laser crystallization method, electrical characteristics such as decrease in the leakage current and enhancement of the sub-threshold slope can be stabilized. Accordingly, the low-temperature poly-crystalline transistors can be applied to pixels and driving circuits. The poly-crystalline thin film transistors can be used for LCDs and OLEDs, including storage capacitors.

As described above, the preferable embodiments of the present invention have been described with reference to the accompanying drawings. However, the present invention is not limited to the above-described embodiments. It is apparent to one who has an ordinary skill in the art that there may be many modifications and variations within the same technical spirit of the invention.

What is claimed is:

1. A method of applying an electrical stress to a low-temperature poly-crystalline thin film transistor including poly-silicon crystallized at a low temperature using a laser crystallization or MILC (Metal Induced Lateral Crystallization) method, the electrical stress application method characterized in that a source of a thin film transistor is grounded, and a critical voltage which is determined according to a gate voltage applied between the drain and the source of the thin film transistor, at a state where any gate voltage has been applied between the gate and the source of the thin film transistor, a drain voltage above a critical voltage which is determined in proportion to an absolute value of the applied gate voltage, is applied between the drain and the source of the thin film transistor, the critical voltage being defined as a minimum voltage for applying the electrical stress to the thin film transistor.

2. The method of applying an electrical stress to a low-temperature poly-crystalline thin film transistor according to claim 1, wherein the gate voltage is set in the range of −100V to 100V, and if the transistor is a P-type, the critical critical voltage determined according to the gate voltage between the drain and source of the transistor is set in the range of 0.5 to 2 times as the gate voltage.

3. The method of applying an electrical stress to a low-temperature poly-crystalline thin film transistor according to claim 1, wherein the applied gate voltage is preferably set to make the thin film transistor turned off.

4. A method of applying an electrical stress to a number of low-temperature poly-crystalline thin film transistors including poly-silicon in which a number of thin film transistors are crystallized at a low temperature using a laser crystallization method or a MILC (Metal Induced Lateral Crystallization) method, for use in a lower insulation substrate for an active matrix display device which Includes a pixel array including a number of thin film transistors (TFTs) where a number of pixel electrodes are disposed in a matrix pattern at crossing portions in a row direction and a column direction, and a drain electrode is connected with the respective pixel electrodes, the electrical stress application method comprising the steps of: extensively forming a number of gate connection lines aligned in a row direction in order to connect the respective gates, and a gate incorporation line which incorporatively connects the number of gate connection lines, a number of source connection lines aligned in a column direction in order to connect the respective sources, and a source incorporation line which incorporatively connects the number of source connection lines, and a number of drain connection lines aligned in a column direction in order to connect the respective drains, and a drain incorporation line which incorporatively connects the number of drain connection lines, with respect to the number of the respective thin film transistors; and applying the ground voltage to the source incorporation line of the thin film transistor, and applying a critical voltage which is determined according to a gate voltage between the drain incorporation line and the source incorporation line of the thin film transistor, at a state where any gate voltage has been applied between the gate incorporation line and the source incorporation line of the thin film transistor, applying a drain voltage above a critical voltage which is determined in proportion to an absolute value of the applied gate voltage between the drain incorporation line and the source incorporation line of the thin film transistor, the critical voltage being defined as a minimum voltage for applying the electrical stress to the thin film transistor.

5. The method of applying an electrical stress to a low-temperature poly-crystalline thin film transistor according to claim 4, wherein the electrical stress is preferably applied at a state where the thin film transistor is turned off.

6. The method of applying an electrical stress to a low-temperature poly-crystalline thin film transistor according to claim 5, wherein in the case that the thin film transistor is a P-type thin film transistor when the thin film transistor is turned off, a gate voltage applied via the gate incorporation line is set to be in the range of −3V to 30V, and a drain voltage applied via the drain incorporation line is set to be in the range of −30V to 0V. In the case that the thin film transistor is an N-type thin film transistor, a gate voltage applied via the gate incorporation line is set to be in the range of 3V to −30V, and a drain voltage applied via the drain incorporation line is set to be in the range of 30V to 0V.

7. The method of applying an electrical stress to a low-temperature poly-crystalline thin film transistor according to claim 4, wherein before extensively forming the gate connection lines, the source connection lines and the drain connection lines, the electrical stress application method according to the third aspect of the present invention further comprises the steps of: forming a pixel array including the number of pixel electrodes and the number of thin film transistors, and forming an insulation film on the upper portion of a lower insulation substrate; and forming a number of contact plugs which are connected with the respective gates, sources and drains of the number thin film transistors located below the insulation film.

* * * * *